United States Patent
Bowlby et al.

(10) Patent No.: US 8,682,632 B1
(45) Date of Patent: Mar. 25, 2014

(54) SIMULATION SYSTEM AND METHOD THEREOF

(75) Inventors: Gavin J. Bowlby, Vista, CA (US); Thomas J. Stiglich, West Linn, OR (US)

(73) Assignee: QLOGIC, Corporation, Aliso Viejo, CA (US)

( * ) Notice: Subject to any disclaimer, the term of this patent is extended or adjusted under 35 U.S.C. 154(b) by 276 days.

(21) Appl. No.: 13/029,018

(22) Filed: Feb. 16, 2011

(51) Int. Cl.
  *G06F 17/50* (2006.01)
  *G06G 7/62* (2006.01)

(52) U.S. Cl.
  USPC .......................................................... 703/13

(58) Field of Classification Search
  USPC .............................. 703/3–4, 13–22
  See application file for complete search history.

(56) References Cited

U.S. PATENT DOCUMENTS

| | | | |
|---|---|---|---|
| 5,088,057 A * | 2/1992 | Amrany et al. ............... | 708/103 |
| 6,404,840 B1 * | 6/2002 | Sindalovsky ................... | 377/48 |
| 6,618,462 B1 * | 9/2003 | Ross et al. ...................... | 377/48 |
| 6,629,256 B1 * | 9/2003 | Ilan et al. ...................... | 713/501 |
| 6,704,380 B1 * | 3/2004 | Kaewell ......................... | 375/367 |
| 6,993,469 B1 * | 1/2006 | Bortfeld ......................... | 703/15 |
| 7,216,250 B2 * | 5/2007 | Matsuoka et al. ............. | 713/503 |
| 8,111,785 B2 * | 2/2012 | Do et al. ........................ | 375/327 |
| 2002/0133325 A1 * | 9/2002 | Hoare et al. ................... | 703/17 |
| 2006/0195310 A1 * | 8/2006 | Vermeersch et al. .......... | 703/19 |
| 2008/0304610 A1 * | 12/2008 | Do et al. ........................ | 375/376 |
| 2010/0274548 A1 * | 10/2010 | Nguyen et al. ................. | 703/14 |
| 2011/0298513 A1 * | 12/2011 | Na et al. ........................ | 327/175 |
| 2012/0101798 A1 * | 4/2012 | Vermeersch et al. .......... | 703/19 |
| 2012/0262207 A1 * | 10/2012 | Burcea .......................... | 327/115 |

FOREIGN PATENT DOCUMENTS

JP  03128529 A  *  5/1991  ............ H03K 21/00

* cited by examiner

*Primary Examiner* — Matt Kim
*Assistant Examiner* — Maryam Ipakchi
(74) *Attorney, Agent, or Firm* — Klein, O'Neill & Singh, LLP

(57) ABSTRACT

A machine implemented method and a system for simulating an electronic design is provided. The method includes determining a clock period based on a first clock having a first clock period and a second clock having a second clock period used for digital applications of an electronic system. The clock period is a repeating decimal or a value that exceeds a resolution of a simulator. The method further includes using the first clock with the first clock period for simulating the electronic system; determining a third clock for a third clock period and a fourth clock for a fourth clock period such that the third clock and the fourth clock when used in simulation provide an average that is substantially similar to the second clock having the second clock period; and using the third clock and the fourth clock, instead of the second clock for simulating the electronic system.

16 Claims, 2 Drawing Sheets

SIMULATION SYSTEM AND METHOD THEREOF

TECHNICAL FIELD

The present invention relates to simulation systems and methods thereof.

RELATED ART

Electronic components and integrated circuits are commonly used in various applications, including computing systems, peripheral devices (adapters, switches and others) and others. These components may include serial/de-serializers (SERDES), state machines, memory controllers, memory interface, processors and others.

Electronic components typically operate at a clock rate. The term clock rate is the rate in bits per second (measured in hertz) of a clock signal, or may be referred to as a frequency of a clock signal that may be provided by a crystal oscillator and converted into a corresponding square wave pulse for digital electronics applications. The clock signal typically has an associated clock period for operation. It is common to have digital components operate at different clock signals having different clock periods.

Often, electronic systems with various digital components are simulated for verification and testing by using a simulator. The simulator attempts to simulate real-time operating parameters and conditions to verify a design's effectiveness.

Simulation is a challenge if a ratio of different clock periods is not an integer value and instead is a repeating decimal or if the ratio exceeds a resolution of the simulator. For example, in a circuit, clocks C1 and C2 may be used for period P1 and P2, where P1/P2 may be a repeating decimal or may represent a value that exceeds the resolution of the simulator. Conventional simulators typically round off the repeating decimal or the period that is beyond the resolution of the simulator. This may be undesirable because rounding off a duration may affect the overall accuracy of the simulation. Continuous efforts are being made for accurately simulating electronic designs.

SUMMARY

The various embodiments of the present system and methods have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description" one will understand how the features of the present embodiments provide advantages.

In one embodiment, a machine implemented method is provided. The method includes determining a clock period based on a first clock having a first clock period and a second clock having a second clock period used for digital applications of an electronic system. The clock period may be a repeating decimal or may exceed a resolution of a simulator. The method further includes, using the first clock with the first clock period for simulating the electronic system; determining a third clock for a third clock period and a fourth clock for a fourth clock period such that the third clock and the fourth clock when used in simulation provide an average that is substantially similar to the second clock having the second clock period; and using the third clock and the fourth clock, instead of the second clock for simulating the electronic system.

In another embodiment, a system is provided. The system includes a processor executing instructions for simulating an electronic system, where the processor is configured to determine a clock period based on a first clock having a first clock period and a second clock having a second clock period used by the electronic system. The clock period may be a repeating decimal or may exceed a resolution of a simulator. The processor uses the first clock with the first clock period for simulating the electronic system; determines a third clock for a third clock period and a fourth clock for a fourth clock period such that the third clock and the fourth clock when used in simulation provide an average that is substantially similar to the second clock having the second clock period.

In yet another embodiment, a machine implemented method for simulating an electronic system is provided. The method includes using a first clock with a first clock period for simulating the electronic system; determining a third clock for a third clock period and a fourth clock for a fourth clock period such that the third clock and the fourth clock when used in a simulation provide an average that is substantially similar to a second clock having a second clock period; wherein the first clock and the second clock provide a clock period that is beyond a resolution of a simulator or a repeating decimal; and using the third clock and the fourth clock, instead of the second clock for simulating the electronic system.

This brief summary has been provided so that the nature of the disclosure may be understood quickly. A more complete understanding of the disclosure can be obtained by reference to the following detailed description of the preferred embodiments thereof concerning the attached drawings.

BRIEF DESCRIPTION OF THE DRAWINGS

The foregoing features and other features of the present disclosure will now be described with reference to the drawings of the various embodiments. In the drawings, the same components have the same reference numerals. The illustrated embodiments are intended to illustrate, but not to limit the disclosure. The drawings include the following Figures.

DETAILED DESCRIPTION

Figure 1:
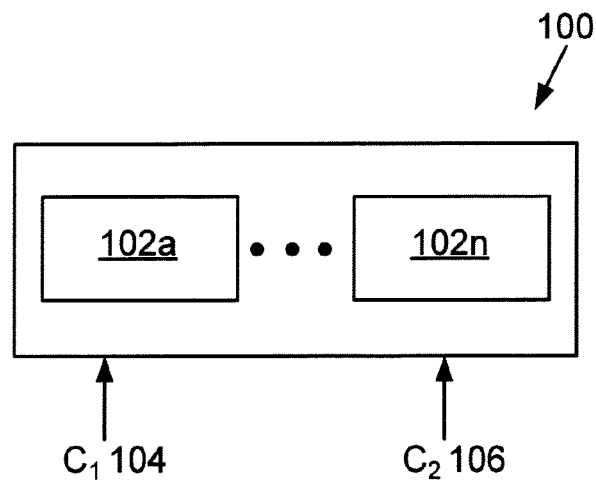
FIG. 1 is a block diagram of a system used according to one embodiment.

The following detailed description describes the present embodiments with reference to the drawings. In the drawings, reference numbers label elements of the present embodiments. These reference numbers are reproduced below in connection with the discussion of the corresponding drawing features.

As a preliminary note, any of the embodiments described with reference to the figures may be implemented using software, firmware, hardware (e.g., fixed logic circuitry), manual processing, or a combination of these implementations. The terms "logic", "module", "component", "system" and "functionality", as used herein, generally represent software, firmware, hardware, or a combination of these elements. For instance, in the case of a software implementation, the terms "logic", "module", "component", "system", and "functionality" represent program code that performs specified tasks when executed on a processing device or devices (e.g., CPU or CPUs). The program code can be stored in one or more computer readable memory devices.

More generally, the illustrated separation of logic, modules, components, systems, and functionality into distinct units may reflect an actual physical grouping and allocation of software, firmware, and/or hardware, or may correspond to a conceptual allocation of different tasks performed by a single software program, firmware program, and/or hardware unit. The illustrated logic, modules, components, systems, and functionality may be located at a single site (e.g., as implemented by a processing device), or may be distributed over a plurality of locations.

The term "machine-readable media" and the like refers to any kind of medium for retaining information in any form, including various kinds of storage devices (magnetic, optical, static, etc.). Machine-readable media also encompasses transitory forms for representing information, including various hardwired and/or wireless links for transmitting the information from one point to another.

The embodiments disclosed herein, may be implemented as a computer process (method), a computing system, or as an article of manufacture, such as a computer program product or computer-readable media. The computer program product may be computer storage media, readable by a computer device, and encoding a computer program of instructions for executing a computer process. The computer program product may also be a propagated signal on a carrier, readable by a computing system, and encoding a computer program of instructions for executing a computer process.

FIG. 1 shows an electronic system 100 having a plurality of components 102a-102n. As an example, system 100 may be an adapter used by a computing system to communicate with a storage device and/or a network device. Components 102a-102n may include serial/de-serializers (SERDES), processor, state machines, memory devices, memory interface, interconnect components, for example, buses and links, interconnect interface, for example, logic and circuitry for PCI-Express links and other components.

The various components may operate using more than one clock signals, shown as C1 104 and C2 106. The clock periods for C1 104 may be T1 and C2 106 may be T2. The ratio of T1/T2 may be an integer, a repeating decimal or a value that may exceed a resolution of a simulator 206a. Most simulators have a pre-defined resolution, for example, 0.000001 nanoseconds (nS) (or 1 femto-second (fs) for handling clock periods. Simulating clocks signals where the clock periods cannot be expressed within the resolution of a simulator or is a repeating decimal is a challenge for conventional simulators. If a desired clock period (for example, T1/T2) is a repeating decimal, for example, 3.199_999_6875 nS, then the clock period is typically rounded off to either 3.199_999 nS or 3.200_000 nS because the simulator resolution of 1 fs is not able to simulate 3.199_999_6875 nS.

In one embodiment, this challenge is overcome by holding one of the clocks, C1 or C2, for their designated periods, i.e., period T1 for clock C1 or period T2 for clock C2. As an example, assume that clock C1 is held for period T1, and C2 is handled based on the embodiments disclosed herein. Instead of using clock C2 for period T2, two or more different clocks, C3 and C4 with durations T3 and T4 are used. Clock C3 may be a faster clock and clock C4 may be a slower clock. The average of clocks C3 and C4 over durations T3+T4 is substantially similar or equal to clock C2 over period T2. Hence, C3 and C4 over duration T3+T4 can simulate the repeating decimal or a value that exceeds the resolution of the simulator, generated by T1/T2. This results in an accurate simulation compared to rounding the decimal based on the simulator's resolution.

Figure 2:
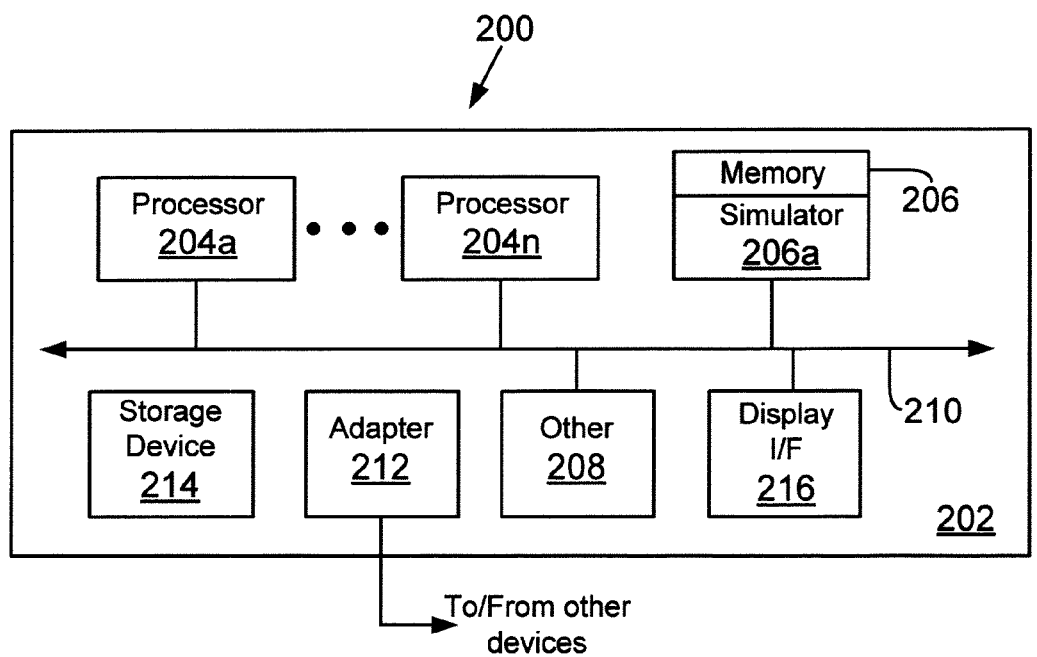
FIG. 2 is a block diagram of a computing system, used according to one embodiment.

FIG. 2 is a block diagram of a system 200 having a computing system 202 (may also be referred to as host system 202) coupled to one or more devices, according to one embodiment. There may be other systems/components that may be used by system 200 but they are not germane to the embodiments disclosed herein.

Host system 202 may include one or more processors 204a-204n (jointly referred to as processor 204 or processors 204), also known as a central processing unit (CPU), interfacing with other components via a bus 210. Bus 210 may be, for example, a system bus, a Peripheral Component Interconnect (PCI) bus (or PCI Express bus), a HyperTransport or industry standard architecture (ISA) bus, a SCSI bus, a universal serial bus (USB), an Institute of Electrical and Electronics Engineers (IEEE) standard 1394 bus (sometimes referred to as "Firewire"), or any other kind of interconnect.

Host system 202 interfaces with memory 206 that may include random access main memory (RAM), and/or read only memory (ROM). When executing stored computer-executable process steps from a storage device, processor 204 may store and execute the process steps out of memory 206. For example, a simulator program 206a may be executed by processor 204 for simulating an electronic design of FIG. 1, according to one embodiment. ROM may store invariant instruction sequences, such as start-up instruction sequences or basic input/output operating system (BIOS) sequences for operation of a keyboard (not shown).

Host system 202 may also include or have access to a storage device 214, which may be for example a hard disk, a CD-ROM, a non-volatile memory device (flash or memory stick) or any other device. Storage device 214 may store processor executable instructions and data, for example, operating system program files, application program files, simulation programs (or simulators) and other files. Some of these files are stored on storage 214 using an installation program. For example, processor 204 may execute computer-executable process steps of an installation program so that the processor 204 can properly execute an application program.

Host system 202 interfaces with a display device (not shown) via a display device interface 216. The display device may be used to present simulation results to a user, according to one embodiment.

Host system 202 may also include other devices and interfaces 208, which may include a keyboard interface, a pointing device interface and others. Host system 202 may also interface with an adapter 212 that may be used to communicate with other devices via a network link (not shown).

Figure 3:
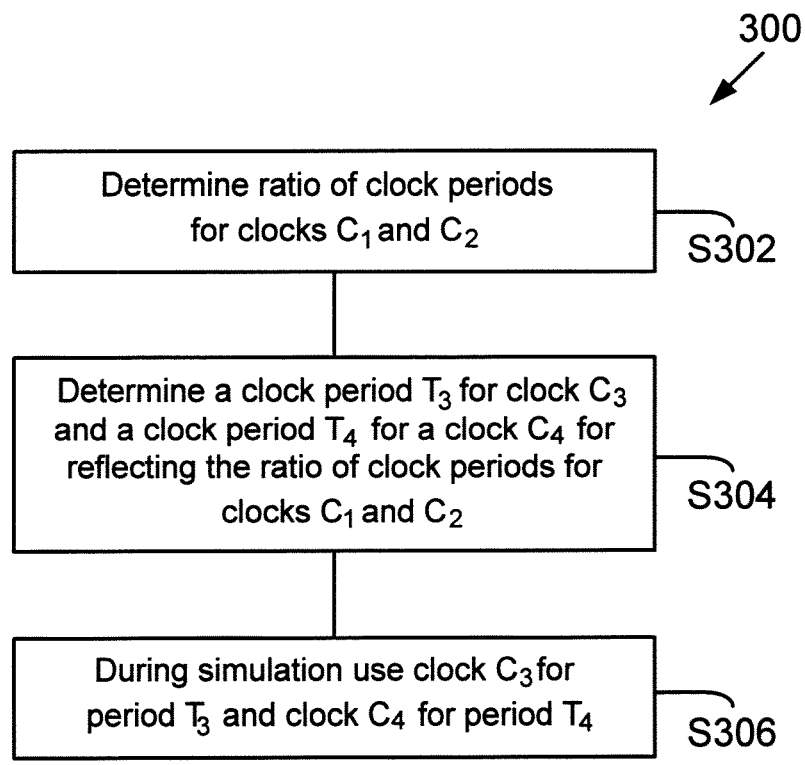
FIG. 3 shows a process flow diagram, according to one embodiment.

FIG. 3 shows a process 300 according to one embodiment. Process 300 may be used by simulator 206a for simulating the electronic system of FIG. 1. The process starts in block S302, when the ratio of clock periods for clocks C1 and C2 are determined. For example, the clock period for C1 may be T1 and the clock period for C2 may be T2. The ratio may be a repeating decimal value or a value that is beyond a resolution of the simulator 206a, for example, 1 fs.

In block S304, a clock C3 having a clock period T3 and a clock C4 having a clock period T4 are determined. Clocks C3 and C4 are intended to replace either C1 or C2 during simulation, as described below in more detail.

In block S306, during simulation, either C1 or C2 are used for their designated period. For example, if C1 is used, then it is held for period T1. In this example, assume that C1 is being held. Instead of using C2 for period T2 during simulation, the simulation program uses C3 for period T3 and C4 for period T4. By using two different clocks for two different durations, the simulator on average gets C2 for period T2. This allows the simulator to accurately simulate the design without having to round off any repeating decimals or values that are beyond the resolution of the simulator.

For example, if T2 is of 3.199_999_6875 nS, one can run 11 clocks at a "slow" rate of 3.2 nS, and then 5 clocks at the "fast" rate of 3.199_999 nS. This provides an average of 3.199_999_6875 nS over 16 clocks.

It is noteworthy that although two different clocks, C3 and C4 have been mentioned above, one can use more than two clocks to simulate the use of clock C2 for handling the repeating decimal or a value that exceeds the resolution of the simulator 206a due to T1/T2.

The following provides an example of programmable instructions that may be used by simulator 206a for handling the non-repeating decimal that occurs between two clock periods:

In one embodiment, one does not have to compromise the accuracy of a simulation because by using at least two different clocks C3 and C4 for periods T3 and T4, one is able to achieve clock C2 as an average. One does not have to round off the repeating decimal or a value that exceeds the resolution of simulator 206a which may result in an inaccurate simulation.

Although the present disclosure has been described with reference to specific embodiments, these embodiments are illustrative only and not limiting. Many other applications and embodiments of the present invention will be apparent in light of this disclosure and the following claims. References throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics being referred to may be com-

```
'define PERIOD_SLOW              3.2              // "slow" clock period for core_clk, in nS
(312.5 MHz)
'define PERIOD_SLOW_DUTY_A       1.6              // duty cycle for 'PERIOD_SLOW, DUTY_A + DUTY_B
= PERIOD_SLOW
'define PERIOD_SLOW_DUTY_B       1.6              // duty cycle for 'PERIOD_SLOW, DUTY_A + DUTY_B
= PERIOD_SLOW
'define PERIOD_FAST              3.199_999        // "fast" clock period for core_clk, in
nS
'define PERIOD_FAST_DUTY_A       1.6              // duty cycle for 'PERIOD_FAST, DUTY_A +
DUTY_B = PERIOD_FAST
'define PERIOD_FAST_DUTY_B       1.599_999        // duty cycle for 'PERIOD_FAST, DUTY_A +
DUTY_B = PERIOD_FAST
'define STATE_SLOW_CTR           11               // this many clocks at 'PERIOD_SLOW,
followed by
'define STATE_FAST_CTR           5                // this many clocks at 'PERIOD_FAST,
yields an effective rate of:
'define PERIOD_EFFECTIVE         3.199_999_6875   // the exact period in nS of core clk
                                                  // the last 4 digits are 11/16 (.6875),
this can't be used in Verilog
'define PERIOD_CYCLE             51.199_995       // time in nS for ('STATE_SLOW_CTR
slow clocks +
                                                  // 'STATE_FAST_CTR fast clocks) to
occur, this should be
                                                  // observable in Verilog sim run
event coreClkRateChangeSlow, coreClkRateChangeFast;   // for waveform viewing
// core_clock driver
initial begin
  core_clk = 0;
  while(1) begin
    ->coreClkRateChangeSlow;                      // for waveform viewing
    for (int i=0; i<'STATE_SLOW_CTR; i++) begin
      #('PERIOD_SLOW_DUTY_A);
      core_clk = ~core_clk;
      #('PERIOD_SLOW_DUTY_B);
      core_clk = ~core_clk;
    end
    ->coreClkRateChangeFast;                      // for waveform viewing
    for (int i=0; i<'STATE_FAST_CTR; i++) begin
      #('PERIOD_FAST_DUTY_A);
      core_clk = ~core_clk;
      #('PERIOD_FAST_DUTY_B);
      core_clk = ~core_clk;
    end
  end
end
```

What is claimed is:

1. A machine implemented method, comprising:
    determining a ratio of a first clock having a first clock period to a second clock having a second clock period, the first and second clocks being used for digital applications of an electronic system; wherein the ratio is a repeating decimal or a value that exceeds a resolution of a simulator;
    using the first clock with the first clock period for simulating the electronic system;
    determining a third clock for a third clock period and a fourth clock for a fourth clock period such that the third clock and the fourth clock when used in simulation provide an average that is closer than the ratio is to the second clock having the second clock period; and
    using the third clock and the fourth clock, instead of the second clock for simulating the electronic system.

2. The method of claim 1, wherein the third clock is faster than the fourth clock.

3. The method of claim 1, wherein the fourth clock is faster than the third clock.

4. The method of claim 1, wherein the third clock period is less than the fourth clock period.

5. The method of claim 1, wherein the third clock period is greater than the fourth clock period.

6. A system, comprising:
    a processor executing instructions for simulating an electronic system, wherein the processor is configured to determine a ratio of a first clock having a first clock period to a second clock having a second clock period, the first and second clocks being used by the electronic system; use the first clock with the first clock period for simulating the electronic system; determine a third clock for a third clock period and a fourth clock for a fourth clock period such that the third clock and the fourth clock when used in simulation provide an average that is closer than the ratio is to the second clock having the second clock period; and use the third clock and the fourth clock, instead of the second clock for simulating the electronic system.

7. The system of claim 6, wherein the third clock is faster than the fourth clock.

8. The system of claim 6, wherein the fourth clock is faster than the third clock.

9. The system of claim 6, wherein the third clock period is less than the fourth clock period.

10. The system of claim 6, wherein the third clock period is greater than the fourth clock period.

11. The system of claim 6, wherein the clock period is a repeating decimal or a value that is beyond a resolution of a simulator.

12. A machine implemented method for simulating an electronic system, comprising:
    using a first clock with a first clock period for simulating the electronic system;
    determining a third clock for a third clock period and a fourth clock for a fourth clock period such that the third clock and the fourth clock when used in a simulation provide an average that is closer to a second clock having a second clock period than is a ratio of the first clock to the second clock; wherein the ratio of the first clock to the second clock is a repeating decimal or a value that is beyond a resolution of a simulator; and
    using the third clock and the fourth clock, instead of the second clock for simulating the electronic system.

13. The method of claim 12, wherein the third clock is faster than the fourth clock.

14. The method of claim 12, wherein the fourth clock is faster than the third clock.

15. The method of claim 12, wherein the third clock period is less than the fourth clock period.

16. The method of claim 12, wherein the third clock period is greater than the fourth clock period.

* * * * *